United States Patent
Pineda De Gyvez et al.

(10) Patent No.: US 7,200,057 B2
(45) Date of Patent: Apr. 3, 2007

(54) TEST FOR WEAK SRAM CELLS

(75) Inventors: Jose De Jesus Pineda De Gyvez, Eindhoven (NL); Manoj Sachdev, Ontario (CA); Andrei Pavlov, Kitchener (CA)

(73) Assignee: NXP B.V., Eindhoven (NL)

( * ) Notice: Subject to any disclaimer, the term of this patent is extended or adjusted under 35 U.S.C. 154(b) by 7 days.

(21) Appl. No.: 10/548,340

(22) PCT Filed: Mar. 3, 2004

(86) PCT No.: PCT/IB2004/050192

§ 371 (c)(1), (2), (4) Date: Sep. 7, 2005

(87) PCT Pub. No.: WO2004/081948

PCT Pub. Date: Sep. 23, 2004

(65) Prior Publication Data

US 2006/0187724 A1    Aug. 24, 2006

(30) Foreign Application Priority Data

Mar. 12, 2003  (EP) .............................. 03100633

(51) Int. Cl.
*G11C 7/00* (2006.01)

(52) U.S. Cl. ...................... 365/201; 365/203

(58) Field of Classification Search ............... 365/201, 365/203
See application file for complete search history.

(56) References Cited

U.S. PATENT DOCUMENTS

| | | | |
|---|---|---|---|
| 7,133,319 B2* | 11/2006 | Wuu et al. ................... | 365/201 |
| 2004/0246797 A1* | 12/2004 | Jeung et al. ................. | 365/201 |
| 2006/0187724 A1* | 8/2006 | Pineda De Gyvez et al. .... | 365/201 |

* cited by examiner

*Primary Examiner*—Michael Tran (57) ABSTRACT

A method and apparatus for testing a static random access memory (SRAM) array for the presence of weak defects. A 0/1 ratio is first written to the memory array (step 100), following which the bit lines BL and BLB are pre-charged and equalized to a threshold detection voltage (step 102). The threshold detection voltage is programmed according to the 0/1 ratio of cells, so as to take into account specific cell criterion and/or characteristics. Next, the word lines associated with all of the cells in the array are enabled substantially simultaneously (step 104), the bit lines are then shorted together (step 106), the word lines are disabled (step 108) and the bit lines are released (step 110). Following these steps, the contents of the SRAM array are read and compared against the original 0/1 ratio (step 112). 10 Any cells whose contents do not match the original 0/1 ratio (i.e. those whose contents have flipped) are marked or otherwise identified as "weak" (step 114).

17 Claims, 7 Drawing Sheets

TEST FOR WEAK SRAM CELLS

This invention relates generally to static random access memory (SRAM) and, more particularly, to a method and apparatus for detecting weak SRAM cells.

A static RAM is a memory chip that requires power to hold its content, i.e. it retains data bits in its memory as long as power is being supplied. It is made up of a flip-flop circuit that lets current flow through one side or the other based on which one of two select transistors is activated. Unlike Dynamic RAM (DRAM), static RAM does not require refresh circuitry for periodically refreshing the cells. SRAM also provides faster access to data than DRAM. However, they also take up more space, use more power and tend to be more expensive. SRAM is commonly used for a computer's cache memory and as part of the random access memory digital-to-analogue converter on a video card, for example.

Figure 1:
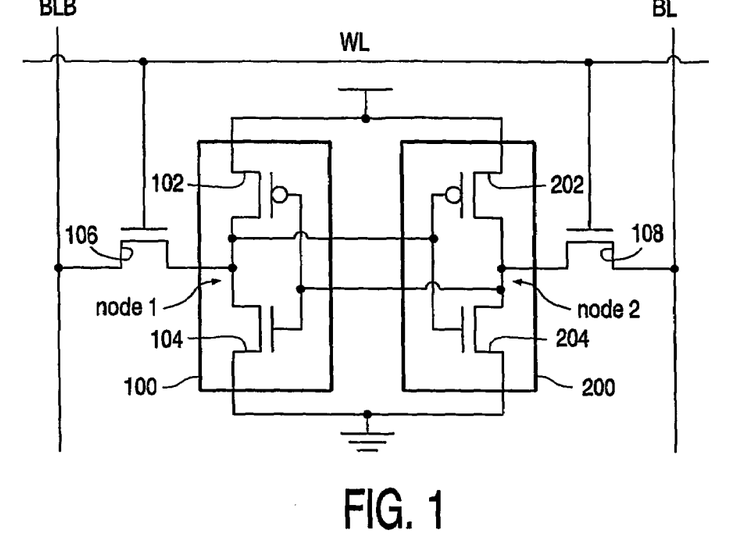
FIG. 1 is a circuit diagram illustrating the configuration of a conventional six-transistor SRAM cell.

FIG. 1 of the drawings illustrates a commonly-used six-transistor (6T) SRAM cell. A first inverter 100 comprising a P-channel transistor 102 and an N-channel transistor 104, and a second inverter 200 comprising a P-channel transistor 202 and an N-channel transistor 204 are interconnected in a known fashion to form a latch. A first N-channel select transistor 106 couples the latch to a first bit line BLB and a second N-channel select transistor 108 couples the latch to a second bit line BL. The gates of the N-channel select transistors 106, 108 are coupled to a word line WL.

The six-transistor (6T) CMOS SRAM cell described above offers many advantages over the conventional four-transistor (4T) SRAM cell for microprocessor or microcontroller designs, including the potential for perfect data retention because of its active pull-up PMOS transistors. However, this perfect data retention potential has not previously been realized, because some open-circuit defects, often called weak defects, are known to cause retention failures. This type of defect, typically caused by factors such as resistive defects, excessive process shifts, transistor mismatch, IR drops, etc., can cause unpredictable data retention failures that are process, temperature and time dependent. As such retention failure tends to be random because cells are not entirely damaged and retention failure (characterized by state flipping) is triggered only under certain operating conditions, such as electrical disturbance (e.g. power supply noise), read/write cell disturbance, etc. during normal operation of the SRAM. As a result, the conventional retention detection technique of high-temperature bakes and test algorithms such as N-March may not detect this type of fault.

Figure 2:
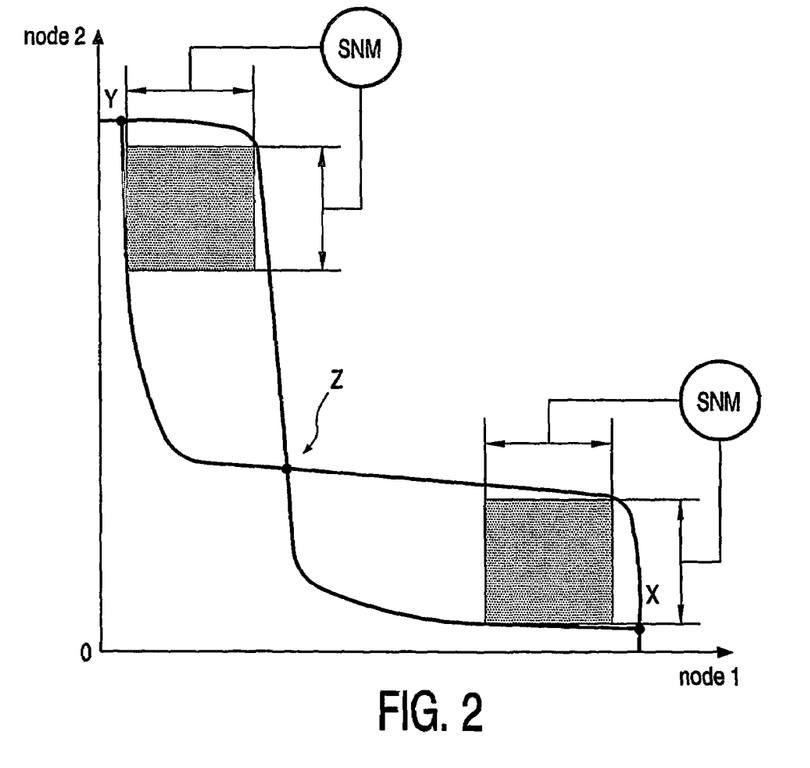
FIG. 2 illustrates a transfer function of a memory cell with highlighted static noise margins.

For the purpose of the following, we can define weak cells as those cells whose static noise margin (SNM) is close to zero and thus such cells can inadvertently flip their state. SNM is a measure of the logic circuit's tolerance to noise in either of the states, i.e. by how much can the input voltage change without disturbing the present logic state. In other words, the SNM represents a measure of cell robustness. Referring to FIG. 2 of the drawings, there is illustrated a transfer function of a memory cell with highlighted static noise margins. The SNM is defined as the side of the maximum square that can be embedded between the transfer characteristics of the two cell inverters. Points X and Y on the characteristics represent two stable states and the intersection point Z represents the meta-stable point. A small disturbance around Z towards X or Y will cause the cell to flip to state X or Y respectively.

The types of defects referred to above tend to involve one or more transistors with undesired electrical-parameter shifts, e.g. shifted threshold voltage, decreased effective transistor length, etc., as well as "weak-ohmic" electrical opens and shorts due to resistive defects. These defects will be referred to hereinafter as "weak defects". U.S. Pat. No. 5,034,923 describes three weak defect detection procedures to fully test the inverters of an SRAM circuit for the presence of weak defects.

The first weak defect detection procedure can be summarized as follows, with reference back to FIG. 1 of the drawings. First, bit line BLB is precharged to a low logic state (i.e. its voltage is brought to a value below the threshold voltages of the transistors). Then, the output of the inverter being tested (say 100) is coupled to bit lines BLB and BL by driving the word line WL to a high logic state (i.e. its voltage is driven to a value above the threshold voltages of the transistors), rendering transistors 106, 108 conductive. Then bit line BL is driven to a low logic state. Finally, the logic state of bit line BLB is sensed.

The second weak detection procedure is similar to the first, but with the logical sense of the states of BLB and BL reversed. In other words, BLB is precharged to a high logic state, then WL is driven to a high state, then BL is driven to a high logic state and the state of BLB is sensed.

As is apparent, the result of each of the first two procedures will be that the logic state of BLB will change from its precharged state if the inverter 100 is properly functioning. In other words, BLB should be in a high state after the first procedure and in a low state after the second.

The third weak defect detection procedure described in U.S. Pat. No. 5,034,923 is designed to detect several instances of soft defects not detectable by the first two procedures. This procedure involves holding the state of BL high and sensing the amount of current leaking through the inverter 100. A current sensor coupled into the Vdd supply line for the SRAM cell detects if the leakage current exceeds a pre-selected limit, in which case the cell is identified as defective.

Figure 3:
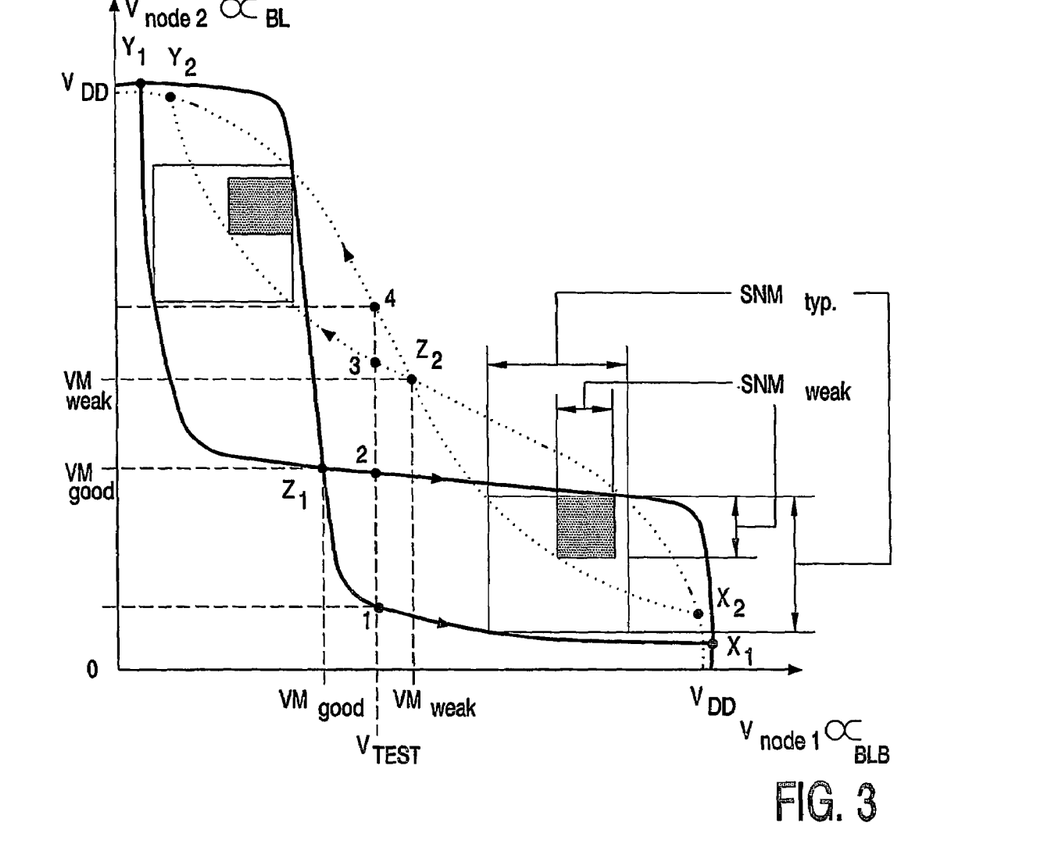
FIG. 3 illustrates the transfer functions of a good and weak SRAM cell respectively.

Referring to FIG. 3 of the drawings, there is illustrated the transfer characteristics of a good SRAM cell (solid line) and a weak SRAM cell (broken line). The axes represent the node voltages which in turn are proportional to the bitline voltages. $VM_{good}$ and $VM_{weak}$ represent the metastability points of a good and a weak cell. If an SRAM cell internal node is brought to the level of VM, then a small voltage increment will flip the cell towards the direction of this increment. Points $X_1$, $Y_1$ ($X_2$, $Y_2$) on the transfer characteristic represent the stable states $Z_1$ ($Z_2$)—the metastable states of the good (weak) cell respectively. As is apparent from FIG. 3, the weak cell has a significantly smaller SNM than that of the good cell.

However, not all cells have the same transfer characteristics, that is to say, the meta-stable points may vary between cells. The meta-stable points may also change due to technology and circuit design. Still further, customer requirements may vary depending on the target application. The test procedures described in U.S. Pat. No. 5,034,923 are somewhat unwieldy in that the test voltages cannot be changed to take these issues into account. This significantly restricts the application field of the described method. Moreover, the techniques described in U.S. Pat. No. 5,034,923 involve activating each word line in an array individually, such that the time it takes to perform the weak cell detection procedures is proportional to the number of word lines in an array, i.e. testing times are relatively long.

We have now devised an arrangement which overcomes the problems outlined above.

Thus, in accordance with a first aspect of the present invention, there is provided apparatus for testing a static random access memory (SRAM) cell for the presence of a weak defect, the SRAM cell having an initial logic state and comprising a flip-flop circuit connected between two bit lines and coupled to a word line, the apparatus comprising:
a) means for pre-charging at least one of said bit lines to a predetermined level;
b) means for enabling said word line; and
c) means for determining, after said word line has been enabled, the logic state of the SRAM cell to determine if the logic state has changed from said initial logic state; characterized in that the apparatus further comprises means for programming a trip voltage based on specific cell criterion and/or characteristics, and means for driving, after said word line has been enabled and before said logic state is determined, at least one of said bit lines, or a node voltage proportional thereto, to said trip voltage.

Also in accordance with the first aspect of the present invention, there is provided a method for testing a static random access memory (SRAM) cell for the presence of a weak defect, the SRAM cell having an initial logic state and comprising a flip-flop circuit connected between two bit lines and coupled to a word line, the method comprising the steps of:
a) pre-charging at least one of said bit lines to a predetermined level;
b) enabling said word line; and
c) determining, after said word line has been enabled, the logic state of the SRAM cell to determine if the logic state has changed from said initial logic state; characterized in that the method further comprises the steps of programming a trip voltage based on specific cell criterion and/or characteristics, and driving, after said word line has been enabled and before said logic state is determined, at least one of said bit lines, or a node voltage proportional thereto, to said trip voltage.

The detection threshold (or trip voltage) programmability of the apparatus and method according to the first aspect of the present invention allows the detection threshold to be varied in order to satisfy different pass criteria. As a result, the method according to the first aspect of the invention is significantly more versatile than that of the prior art.

In accordance with a second aspect of the present invention, there is provided apparatus for testing a static random access memory (SRAM) array for the presence of weak defects, the memory array comprising a plurality of SRAM cells each having an initial logic state, a pair of bit lines to which each SRAM cell is connected, each SRAM cell being coupled to a respective word line, the apparatus comprising means for pre-charging at least one of said bit lines to a predetermined level, means for enabling said word lines, means for driving at least one of said bit lines, or a node voltage proportional thereto, to a predetermined trip voltage, means for identifying the logic state of each of the SRAM cells after said at least one bit line, or node voltage proportional thereto, has been driven to said predetermined trip voltage to determine if the logic state of any of the cells has changed from said initial logic state, and means for marking or otherwise identifying as weak those cells whose logic state has been determined to have changed from said initial logic state; characterized in that said means for enabling said word lines comprises means for enabling substantially simultaneously all of said word lines in said memory array.

Also in accordance with the second aspect of the present invention, there is provided a method for testing a static random access memory (SRAM) array for the presence of weak defects, the memory array comprising a plurality of SRAM cells each having an initial logic state, a pair of bit lines to which each SRAM cell is connected, each SRAM cell being coupled to a respective word line, the method comprising the steps of pre-charging at least one of said bit lines to a predetermined level, enabling said word lines, driving at least one of said bit lines, or a node voltage proportional thereto, to a predetermined trip voltage, identifying the logic state of each of the SRAM cells after said at least one bit line, or node voltage proportional thereto, has been driven to said predetermined trip voltage to determine if the logic state of any of the cells has changed from said initial logic state, and marking or otherwise identifying as weak those cells whose logic state has been determined to have changed from said initial logic state; characterized in that said step of enabling said word lines comprises enabling substantially simultaneously all of said word lines in said memory array.

Because the apparatus and method of the second aspect of the invention involves parallel word line activation, all of the cells in an array can be tested in much less time than in the single word line activation techniques of the prior art.

In a preferred embodiment, the trip voltage is programmed according to the ratio of 0's and 1's contained in the SRAM cells. For the purposes of this specification, a weak cell can be considered to be defined as having a significantly lower static noise margin than that of a good SRAM cell.

These and other aspects of the invention will be apparent from and elucidated with reference to the embodiments described hereinafter.

Embodiments of the present invention will now be described by way of examples only and with reference to the accompanying drawings, in which.

Referring to FIGS. 1 and 3 of the drawings, let us assume that node 1 of an SRAM cell has logic state "1" and that the bit lines are charged to a known value (say Vdd/2). Now assume that by certain manipulation on the bit line bar voltage, $V_{node\ 1}$ is brought down from a stable state 'X' to $V_{TEST}$ by means of the method according to an exemplary embodiment of the present invention, while the bit line is left floating. $V_{TEST}$ represents the programmable weak cell detection threshold. As is apparent from FIG. 3 of the drawings, the weak cell will fail if $(Vdd-V_{TEST})<Vdd-VM_{weak})$, whereas the good cell will retain its state.

Voltage level $V_{TEST}$ crosses the good cell transfer characteristics at points "1" and "2" and it crosses the weak cell transfer characteristics at points "3" and "4", as shown in FIG. 3. Node 1 of the good cell will retain its value (state "1") while node 1 of the weak cell will flip to state "0". The arrows in FIG. 3 show the direction of the transfer characteristic dynamics in this case.

The above-described principle is utilized in the method according to the following exemplary embodiments of the present invention, i.e. all the cells which flip at the node voltage above $V_{TEST}$ are deemed weak and are sorted out.

$$\text{Let us now define the ratio } R = \frac{\text{number of cells with state "1" in a given column}}{\text{total number of cells in the same column}}$$

In this definition, it is assumed that the cells not having state "1" are written state "0", as can be seen from the definition of R, R∈[0,1].

Figure 4:
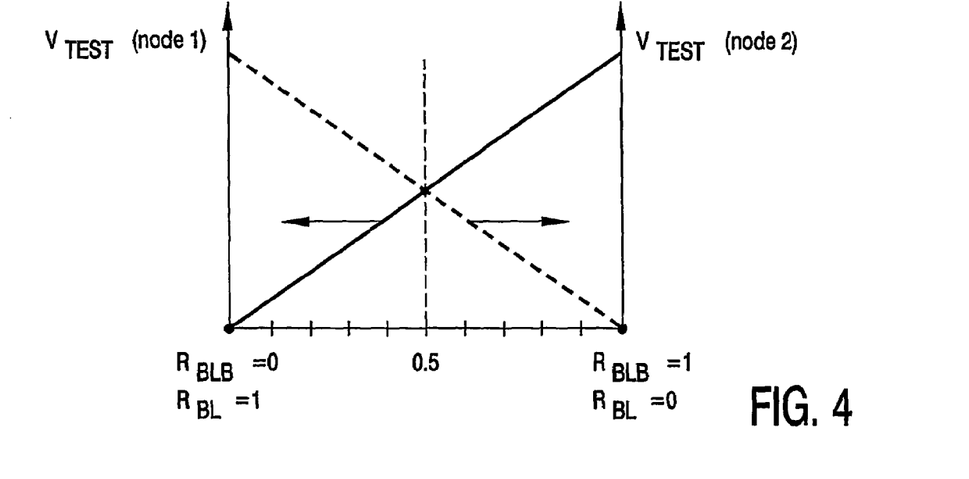
FIG. 4 illustrates $V_{TEST}$ as a function of R for BL and BLB.

Assume that a predetermined 0/1 pattern R is written to a memory array of SRAM cells. Now, if all of the word lines are enabled at the same time, a programmable $V_{TEST}$ voltage on the bit lines can be achieved. Different $V_{TEST}$ voltages and therefore the weak cell detection threshold values can be obtained by changing the ratio R. The dependence of $V_{TEST}$ on R for BL and BLB is illustrated in FIG. 4 of the drawings.

Figure 5:
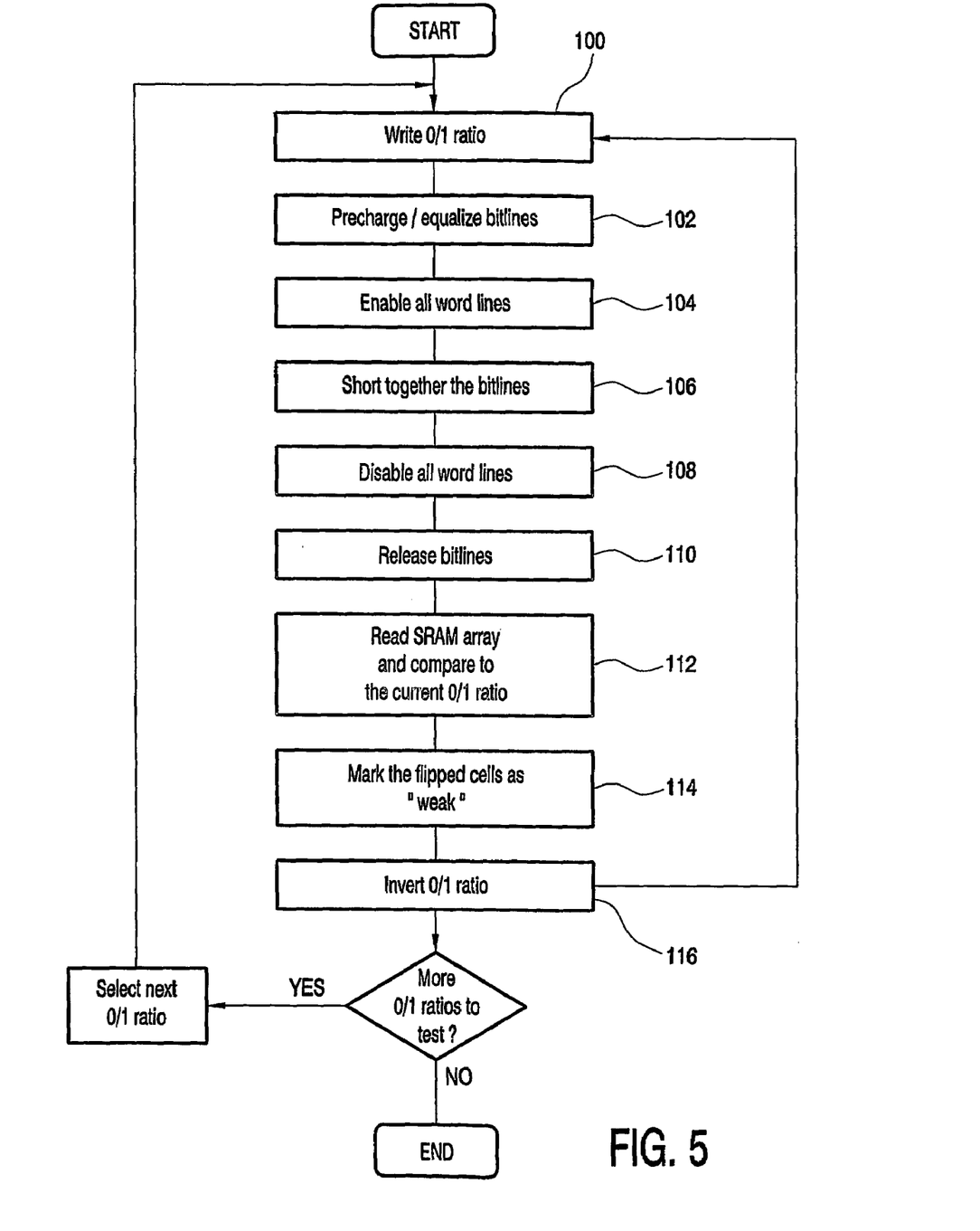
FIG. 5 is a schematic flow diagram illustrating a method according to an exemplary embodiment of the present invention.

Referring to FIG. 5 of the drawings, an embodiment of a method according to the present invention will be described by way of example only. At step 100, a 0/1 ratio is written to the memory array. At step 102, the bit lines BL and BLB are precharged and equalized to $V_{TEST}$. $V_{TEST}$ is selected or programmed according to the 0/1 ratio of cells, as described above with reference to FIG. 4 of the drawings. At step 104, the word lines associated with all of the SRAM cells in the array are enabled in parallel, and at step 106 the bit lines BL and BLB are shorted together. The word lines are then disabled (at step 108) and the bit lines are released (at step 110). The contents of the SRAM array are then read and compared against the current 0/1 ratio as written to the array at step 100 (step 112). Any cells whose contents do not match the original 0/1 ratio (i.e. whose state has flipped) are marked or otherwise identified as "weak" (at step 114). The 0/1 ratio is inverted (at step 116) and steps 100 to 114 are repeated for the inverted 0/1 ratio. This inverted 0/1 ratio is used to detect weak cells that may flip in the opposite direction. This method is repeated for all 0/1 ratios required to be tested.

Figure 6:
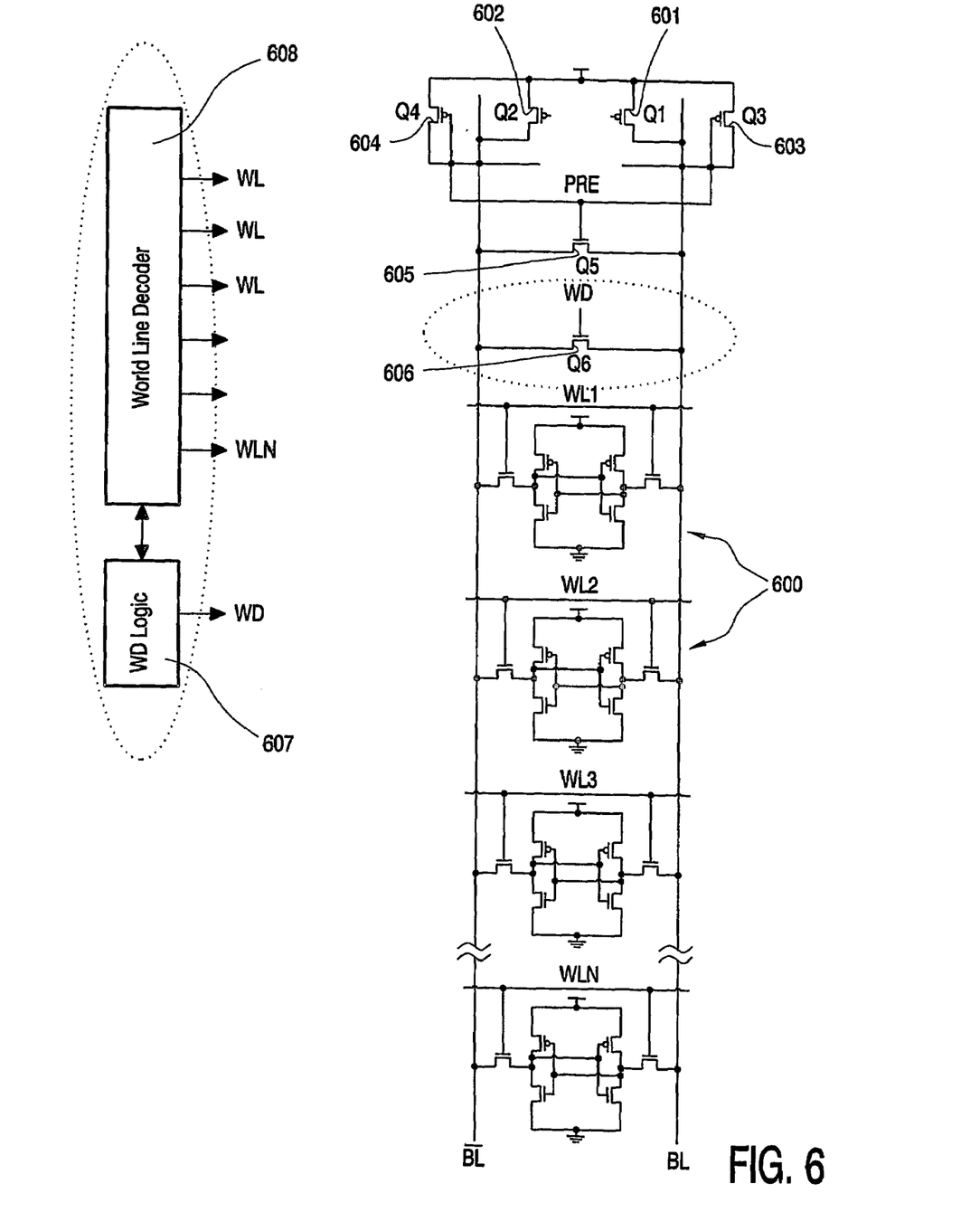
FIG. 6 is a circuit diagram illustrating apparatus according to a first exemplary embodiment of the present invention.

Referring to FIG. 6 of the drawings, apparatus according to a first exemplary embodiment of the present invention will now be described. The illustrated apparatus comprises one column of memory cells 600, with two cross-coupled PMOS transistors 601, 602 to pull up the bit lines, three other PMOS transistors 603, 604, 605 to precharge the bit lines to Vdd, one NMOS transistor 606 to short the bit lines together, appropriate logic 607 to issue the weak-detect (WD) signal, an a word line decoder 608 for simultaneous enablement of the word lines.

The weak cell detection phase starts by programming the trip point $V_{TEST}$ that is necessary to detect cells with a low SNM. This is done by writing a predetermined number of cells with either a '1' or a '0' state. The bit lines are then precharged to Vdd by the transistors 603, 604, 605. After this bit line precharging finishes, all word lines are simultaneously enabled, thereby connecting in parallel all cells 600 of the same column. Under this configuration, access transistors share a common gate and a common bit line node. The other access transistor terminal is connected either to the ground or Vdd through the corresponding NMOS or PMOS driver transistors of the memory cell. The access transistors operate as resistors, dividing the power supply voltage on either bit line between Vdd and ground depending on the equivalent DC path resistance. For example, a bit line node is held at Vdd/2 when 50% of the cells are in state '0', because the path resistance to ground and Vdd is the same, i.e. R=0.5.

Figure 7:
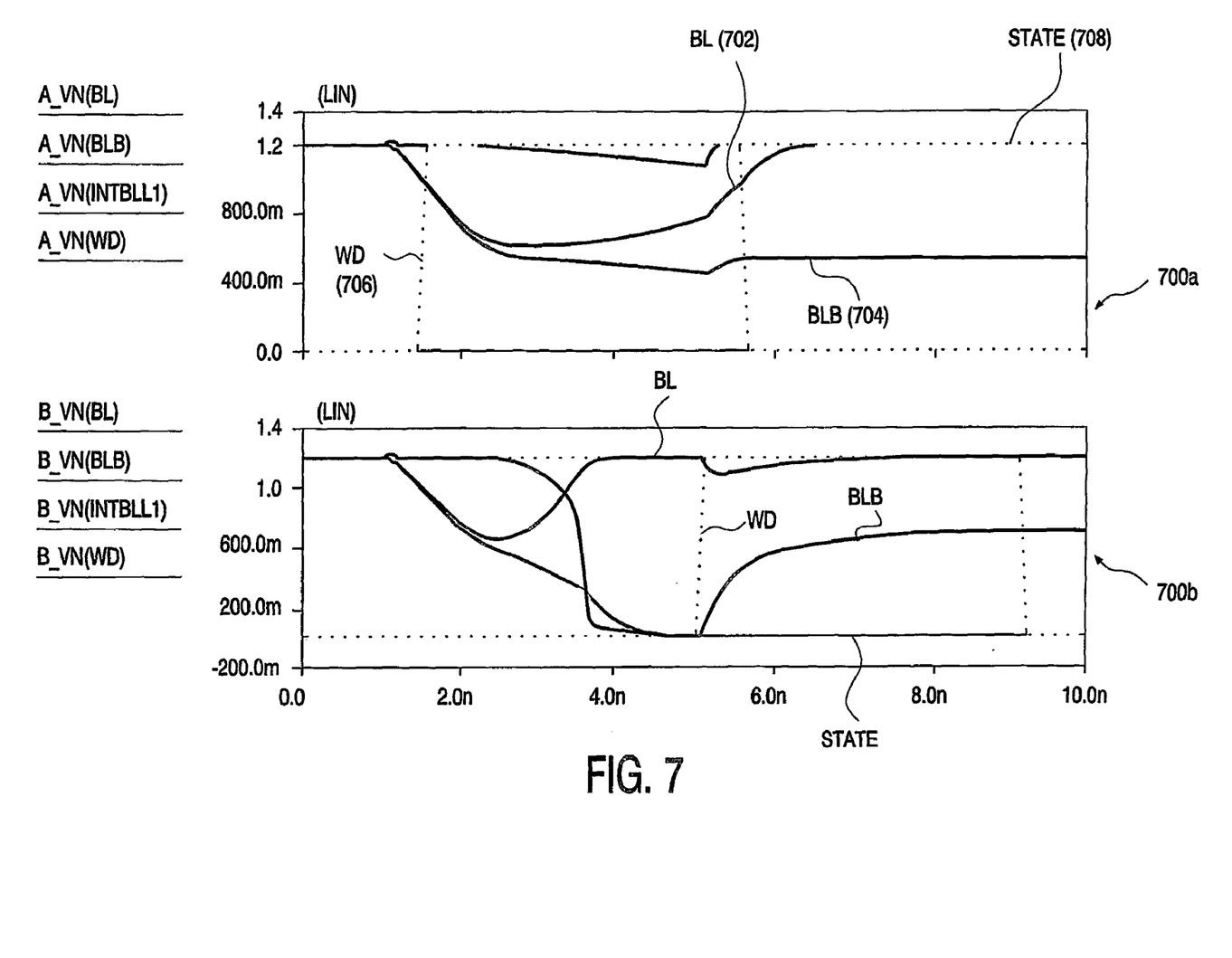
FIG. 7 is a graph illustrating simulation results of operation of the apparatus of FIG. 6.

The graph of FIG. 7 illustrates simulation results of the above-described implementation. The curves correspond to the bit lines BL (702), BLB (704), the weak detection signal WD (706) and the cell's state voltages (708). The upper graph 700a illustrates the situation whereby the bit lines are timely shorted together, whereas the lower graph 700b illustrates the situation whereby the bit lines are shorted together too late. In the latter case, it can be seen how the internal state of the cell flips to state '0'. Note that when the word lines are enabled, the bit line capacitance discharges according to the time constant created by the equivalent path resistance. Further, if the discharge voltage drops below Vdd/2 (which could also be the metastable point), even the good cells will flip, which may cause one of the bit lines to be pulled to ground and restore the other bit line to Vdd. Thus, to prevent the cells from reaching the metastable point, the bit lines are shorted together through an NMOS pass transistor 606 using signal WD. This causes the voltages at the bit lines to remain constant at around Vdd/2 while the cell dynamic finds a new equilibrium. In other words, the bit lines are not pulled to complementary logical values. However, a bit line voltage around Vdd/2 is sufficient to flip weak cells. For a ratio R≠0.5, the corresponding path resistances to Vdd and ground are also different and thus the bit line voltage is simply pulled earlier above or below Vdd/2.

Figure 8:
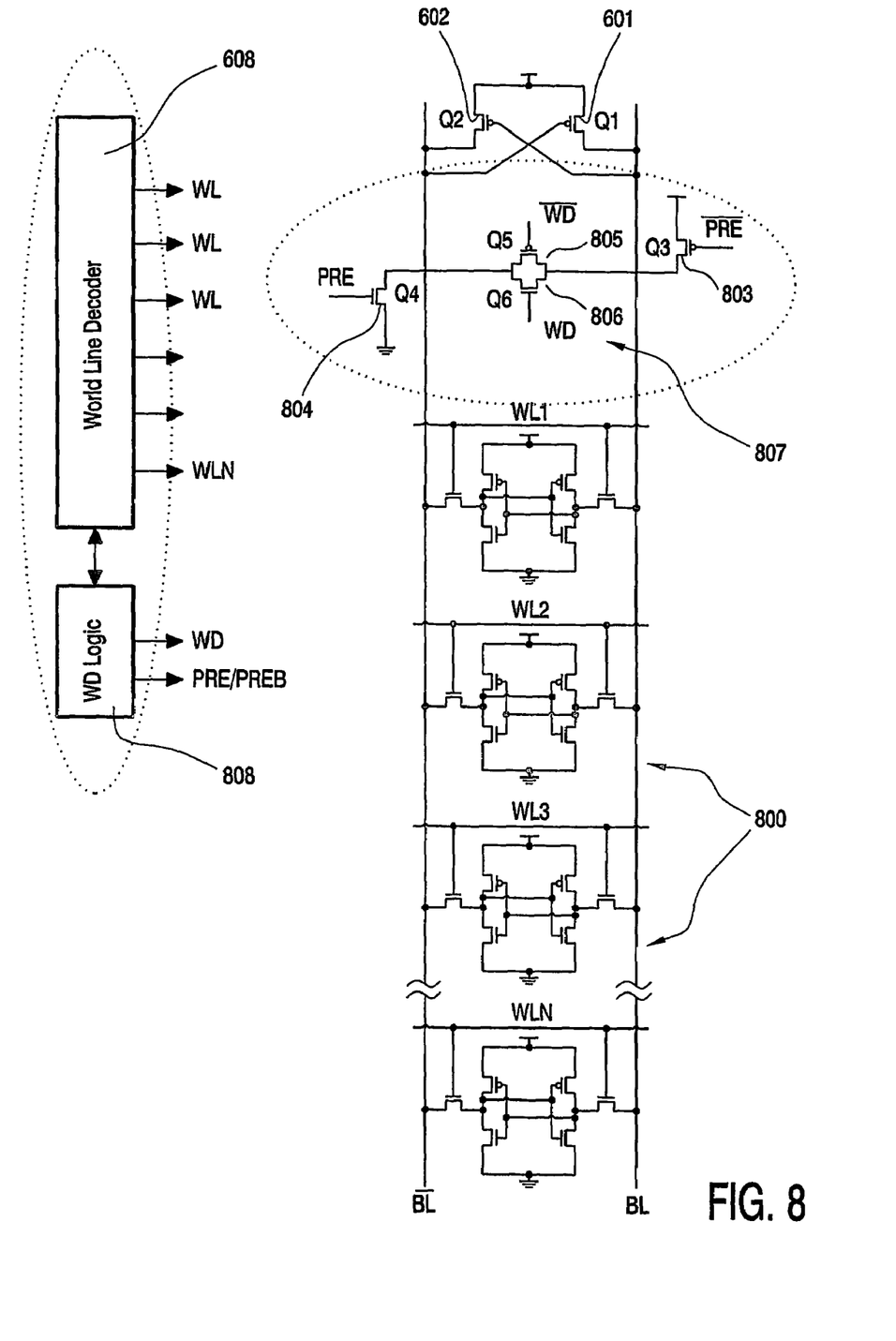
FIG. 8 is a circuit diagram illustrating apparatus according to a second exemplary embodiment of the present invention.

Referring to FIG. 8 of the drawings, apparatus according to a second exemplary embodiment of the invention comprises a column of memory cells 800, pull-up and pull-down MOS transistors 803, 804 tied to the bit lines, a CMOS switch 807 comprising transistors 805, 806 to short the bit lines together, and appropriate logic 808 to enable all word lines simultaneously and to test-precharge the bit lines.

Figure 9:
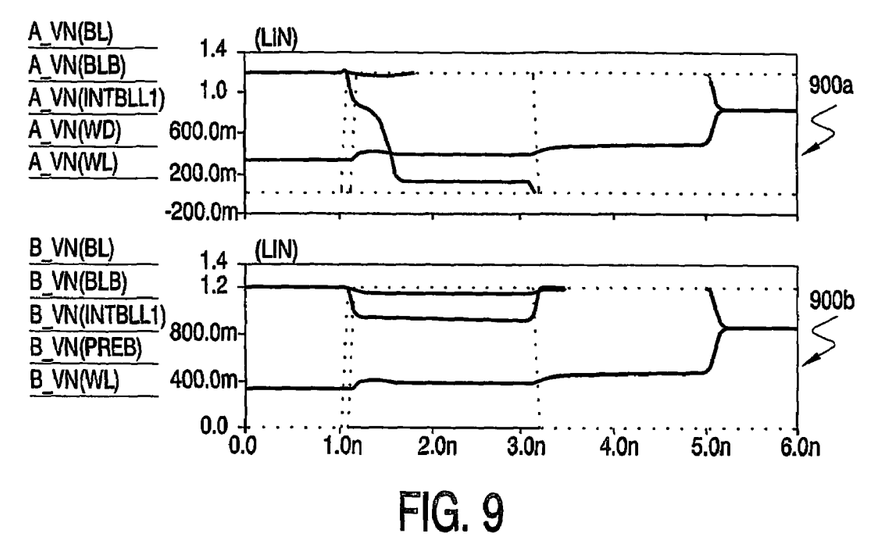
FIG. 9 is a graph illustrating the behavior of bit line voltages during operation of the apparatus of FIG. 8.
Figure 10:
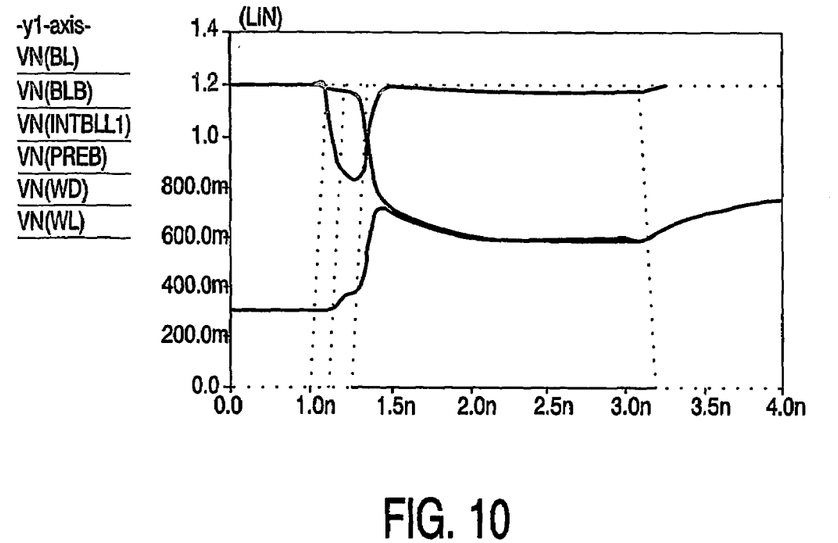
FIG. 10 is a graph illustrating the correct behavior of the apparatus of FIG. 8 when signal WD is timely issued.

In contrast with the apparatus described with reference to FIG. 6, in this embodiment of the apparatus, the bit lines are precharged to Vdd and to ground, rather than only to Vdd. When the word lines are enabled, the bit line precharging works in a similar way to that described with reference to FIG. 6 to write operation forcing all the cells to have the same state. Although the precharging and word line enabling stages have been described herein as being mutually exclusive, in practice, a small overlap exists between them. If this overlap is sufficiently long, even the good cells will flip. FIG. 9 illustrates this behavior in the absence of the WD pulse. The upper graph 900a depicts the case when a good cell flips due to an overlap between precharge and WL signals of about 120 ps. The lower graph 900b shows the expected behavior when the overlap is 60 ps. Fortunately, the time window of the overlap can be compensated by timely shorting together the bit lines, as illustrated in the graph of FIG. 10.

Embodiments of the present invention have been described herein by way of examples only, and it will be apparent to persons skilled in the art that modifications and variations can be made to the described embodiments without departing from the scope of the invention as defined in the appended claims. Further, the term 'comprising' does not preclude other elements or steps, 'a' or 'an' does not exclude a plurality, and a single element or unit may fulfil the functions of several means recited in the claims.

The invention claimed is:

1. Apparatus for testing a static random access memory (SRAM) cell for the presence of a weak defect, the SRAM cell having an initial logic state and comprising a flip-flop circuit connected between two bit lines (BL, BLB) and coupled to a word line (WL), the apparatus comprising:
   a) means for pre-charging at least one of said bit lines (BL, BLB) to a predetermined level;
   b) means for enabling said word line (WL); and
   c) means for determining, after said word line (WL) has been enabled, the logic state of the SRAM cell to determine if the logic state has changed from said initial logic state;
   characterized in that the apparatus further comprises means for programming a trip voltage based on specific cell criterion and/or characteristics, and means for driving, after said word line (WL) has been enabled and before said logic state is determined, at least one of said bit lines (BL, BLB), or a node voltage proportional thereto, to said trip voltage.

2. Apparatus according to claim 1, wherein said trip voltage is programmed according to the initial logic state of said SRAM cell.

3. Apparatus according to claim 2, comprising means for determining the initial logic state of each of the SRAM cells in the array, and programming said trip voltage according to the ratio of 0's and 1's contained therein.

4. Apparatus according to claim 3, comprising means for determining the logic state of all of said SRAM cells after said word lines (WL) have been enabled and marking or otherwise identifying as weak those cells whose logic state is determined to have changed from said initial logic state.

5. Apparatus according to claim 4, wherein a weak cell is defined as having a significantly lower static noise margin than that of a good cell.

6. Apparatus according to claim 1 for testing an SRAM array for the presence of weak cells, said SRAM array comprising a plurality of SRAM cells all connected between the same two bit lines (BL, BLB) and each being coupled to a respective word line (WL).

7. Apparatus according to claim 6, wherein said means for enabling the word line (WL) comprises means for enabling substantially simultaneously all of the word lines to which said plurality of SRAM cells are respectively coupled.

8. Apparatus according to claim 1, comprising means for shorting together said bit lines (BL, BLB) after said word line(s) has (have) been enabled.

9. Apparatus according to claim 8, wherein said means for shorting together the bit lines comprises a MOS transistor connected between said bit lines.

10. Apparatus according to claim 9, wherein said means for shorting together the bit lines comprises an NMOS transistor.

11. Apparatus according to claim 8, wherein said means for shorting together the bit lines (BL, BLB) comprises a CMOS switch connected between the bit lines.

12. Apparatus according to claim 11, wherein said CMOS switch comprises two transistors.

13. Apparatus for testing a static random access memory (SRAM) array for the presence of weak cells, the memory array comprising a plurality of SRAM cells each having an initial logic state, a pair of bit lines (BL, BLB) to which each SRAM cell is connected, each SRAM cell being coupled to a respective word line (WL), the apparatus comprising means for pre-charging at least one of said bit lines (BL, BLB) to a predetermined level, means for enabling said word lines (WL), means for driving at least one of said bit lines, or a node voltage proportional thereto, to a predetermined trip voltage, means for identifying the logic state of each of the SRAM cells after said at least one bit line, or node voltage proportional thereto, has been driven to said predetermined trip voltage to determine if the logic state of any of the cells has changed from said initial logic state, and means for marking or otherwise identifying as weak those cells whose logic state has been determined to have changed from said initial logic state;
   characterized in that said means for enabling said word lines comprises means for enabling substantially simultaneously all of said word lines in said memory array.

14. Apparatus according to claim 13, comprising means for programming said predetermined trip voltage based on specific cell criterion and/or characteristics.

15. Apparatus according to claim 14, wherein said means for programming said trip voltage does so based on the ratio of opposing initial logic states of said SRAM cells.

16. A method for testing a static random access memory (SRAM) cell for the presence of a weak defect, the SRAM cell having an initial logic state and comprising a flip-flop circuit connected between two bit lines (BL, BLB) and coupled to a word line (WL), the method comprising the steps of:
   a) pre-charging at least one of said bit lines to a predetermined level;
   b) enabling said word line; and
   c) determining, after said word line has been enabled, the logic state of the SRAM cell to determine if the logic state has changed from said initial logic state;
   characterized in that the method further comprises the steps of programming a trip voltage based on specific cell criterion and/or characteristics, and driving, after said word line has been enabled and before said logic state is determined, at least one of said bit lines, or a node voltage proportional thereto, to said trip voltage.

17. A method for testing a static random access memory (SRAM) array for the presence of weak cells, the memory array comprising a plurality of SRAM cells each having an initial logic state, a pair of bit lines (BL, BLB) to which each SRAM cell is connected, each SRAM cell being coupled to a respective word line (WL), the method comprising the steps of pre-charging at least one of said bit lines to a predetermined level, enabling said word lines, driving at least one of said bit lines, or a node voltage proportional thereto, to a predetermined trip voltage, identifying the logic state of each of the SRAM cells after said at least one bit line, or node voltage proportional thereto, has been driven to said predetermined trip voltage to determine if the logic state of any of the cells has changed from said initial logic state, and marking or otherwise identifying as weak those cells whose logic state has been determined to have changed from said initial logic state; characterized in that said step of enabling said word lines comprises enabling substantially all of said word lines in said memory array.

* * * * *